US012150266B2

(12) United States Patent
Park et al.

(10) Patent No.: US 12,150,266 B2
(45) Date of Patent: Nov. 19, 2024

(54) ELECTRONIC DEVICE COMPRISING INTERPOSER

(71) Applicant: Samsung Electronics Co., Ltd., Suwon-si (KR)

(72) Inventors: Junghoon Park, Suwon-si (KR); Seungbo Shim, Suwon-si (KR); Yongjin Woo, Suwon-si (KR); Junhee Han, Suwon-si (KR); Dongil Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 139 days.

(21) Appl. No.: 17/893,739

(22) Filed: Aug. 23, 2022

(65) Prior Publication Data

US 2022/0400572 A1  Dec. 15, 2022

Related U.S. Application Data

(63) Continuation of application No. PCT/KR2021/000372, filed on Jan. 12, 2021.

(51) Int. Cl.
  *H05K 7/14* (2006.01)
  *H05K 1/02* (2006.01)
  (Continued)

(52) U.S. Cl.
  CPC ......... *H05K 7/1427* (2013.01); *H05K 1/0277* (2013.01); *H05K 5/0017* (2013.01); *H04M 1/0277* (2013.01)

(58) Field of Classification Search
  CPC .. H05K 5/0025; H05K 5/0017; H05K 7/1427; H05K 1/0277
  (Continued)

(56) References Cited

U.S. PATENT DOCUMENTS 10,342,131 B1 * 7/2019 Kim .................... H05K 1/0243
2009/0268422 A1  10/2009 Bailey et al.
(Continued)

FOREIGN PATENT DOCUMENTS

JP  2001-111232 A  4/2001
JP  2006-237276 A  9/2006
(Continued)

OTHER PUBLICATIONS

Extended European Search Report dated Sep. 12, 2023, issued in European Application No. 21760698.7-1211.
(Continued)

*Primary Examiner* — Hung S. Bui
(74) *Attorney, Agent, or Firm* — Jefferson IP Law, LLP

(57) ABSTRACT

An electronic device is provided. The electronic device includes a housing, a first printed circuit board disposed in the inner space of the housing, a second printed circuit board disposed so as to overlap at least a portion of the first printed circuit board, when the first printed circuit board is viewed from above, a first interposer disposed between the first printed circuit board and the second printed circuit board, and electrically connecting the first printed circuit board and the second printed circuit board, and at least one second interposer which is disposed between the first printed circuit board and the second printed circuit board so as to be spaced apart from the first interposer when the first printed circuit board is viewed from above, and which electrically connects the first printed circuit board and the second printed circuit board.

16 Claims, 20 Drawing Sheets

(51) Int. Cl.
*H05K 5/00* (2006.01)
*H04M 1/02* (2006.01)

(58) Field of Classification Search
USPC ........ 361/752, 796, 800, 728, 807, 809, 810
See application file for complete search history.

(56) References Cited

U.S. PATENT DOCUMENTS

| | | | |
|---|---|---|---|
| 2012/0243195 A1* | 9/2012 | Lim .................. | H05K 1/141 |
| | | | 361/784 |
| 2019/0082536 A1 | 3/2019 | Park et al. | |
| 2019/0313529 A1* | 10/2019 | Kim .................. | H05K 1/115 |
| 2021/0144856 A1* | 5/2021 | Park ................. | H05K 1/145 |
| 2023/0403795 A1* | 12/2023 | Ha ................... | H05K 1/144 |

FOREIGN PATENT DOCUMENTS

| | | |
|---|---|---|
| KR | 10-2019-0029215 A | 3/2019 |
| KR | 10-2019-0139597 A | 12/2019 |
| KR | 10-2019-0139653 A | 12/2019 |

OTHER PUBLICATIONS

Korean Office Action dated Sep. 11, 2024, issued in Korean Application No. 10-2020-0075963.

* cited by examiner

ELECTRONIC DEVICE COMPRISING INTERPOSER

CROSS-REFERENCE TO RELATED APPLICATION(S)

This application is a continuation application, claiming priority under § 365(c), of an International application No. PCT/KR2021/000372, filed on Jan. 12, 2021, which is based on and claims the benefit of a Korean patent application number 10-2020-0023487, filed on Feb. 26, 2020, in the Korean Intellectual Property Office, and of a Korean patent application number 10-2020-0075963, filed on Jun. 22, 2020, in the Korean Intellectual Property Office, the disclosure of each of which is incorporated by reference herein in its entirety.

BACKGROUND

1. Field

The disclosure relates to an electronic device including an interposer.

2. Description of Related Art

An electronic device has gradually become slimmer in order to secure competitiveness with other manufacturers, and has been developed so as to increase stiffness of the electronic device, reinforce the design aspect, and differentiate functional elements thereof at the same time.

A plurality of electronic components disposed in an inner space of the electronic device should be efficiently disposed to help slimming of the electronic device. Further, in case that the plurality of electronic components are unable to function properly even if they are disposed in the inner space of the electronic device, this may cause quality deterioration of the electronic device, and the electronic device has been developed to satisfy the above conditions.

The above information is presented as background information only to assist with an understanding of the disclosure. No determination has been made, and no assertion is made, as to whether any of the above might be applicable as prior art with regard to the disclosure.

SUMMARY

An electronic device may include at least one electronic component disposed in the inner space thereof. The at least one electronic component may be electrically connected to each other in order to perform corresponding functions of the electronic device. Such electronic components may include at least two printed circuit boards disposed in the inner space of the electronic device. In order to secure an efficient mounting space, the printed circuit boards may be disposed to be laminated to each other, and may be electrically connected to each other through an interposer (e.g., laminated board) disposed between the printed circuit boards. For example, the printed circuit boards may include a plurality of conductive terminals, which come in physical contact with a plurality of corresponding conductive terminals disposed on a corresponding surface of the interposer, and thus the two printed circuit boards may be electrically connected to each other.

The interposer may be formed in a shape corresponding to at least one of the two printed circuit boards. For example, if any one of the two printed circuit boards is not in a standardized rectangular shape, but includes a protrusion part that is at least partly protruded, the interposer may also include substantially the same protrusion part as that of the printed circuit board.

However, the protrusion part of the interposer may be damaged by an external impact, such as dropping of the electronic device. Since the two printed circuit boards include a space in which they are spaced apart from each other through the interposer, they may be changed or damaged by the external impact. Further, in case that electrical elements (e.g., power transfer elements and/or signal transfer elements) are disposed on any one printed circuit board, and are electrically connected to the remaining printed circuit board through the interposer, signal and/or power wirings are transferred to pass over through one interposer, and thus the signal and/or power transfer efficiency may be degraded.

Aspects of the disclosure are to address at least the above-mentioned problems and/or disadvantages and to provide at least the advantages described below. Accordingly, an aspect of the disclosure is to provide an electronic device including an interposer.

Another aspect of the disclosure is to provide an electronic device including an interposer, which can adaptively respond to a shape of a printed circuit board.

Another aspect of the disclosure is to provide an electronic device including an interposer, which is configured to improve a signal and/or power transfer efficiency.

Another aspect of the disclosure is to provide an electronic device including an interposer, which has a stiffness reinforcement structure capable of enduring an external impact, such as when the electronic device is dropped.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first printed circuit board disposed in an inner space of the housing, a second printed circuit board disposed to overlap at least a part of the first printed circuit board when the first printed circuit board is viewed from above, a first interposer disposed between the first printed circuit board and the second printed circuit board, and configured to electrically connect the first printed circuit board and the second printed circuit board to each other, and at least one second interposer disposed spaced apart from the first interposer between the first printed circuit board and the second printed circuit board when the first printed circuit board is viewed from above, and configured to electrically connect the first printed circuit board and the second printed circuit board to each other.

In accordance with another aspect of the disclosure, an electronic device is provided. The electronic device includes a housing, a first printed circuit board disposed in an inner space of the housing, and including a plurality of first conductive terminals, a second printed circuit board disposed to overlap at least a part of the first printed circuit board when the first printed circuit board is viewed from above, and including a plurality of second conductive terminals, an interposer including a plurality of conductive vias configured to electrically connect the first printed circuit board and the second printed circuit board to each other between the first printed circuit board and the second printed circuit board, and including a loop-shaped opening, and at least one support disposed to come in physical contact with the first printed circuit board and the second printed circuit board at a location overlapping the opening between the first printed circuit board and the second printed circuit board when the first printed circuit board is viewed from above.

According to various embodiments of the disclosure, since at least one interposer is additionally disposed between two printed circuit boards, it is possible to adaptively cope with various shapes of the two printed circuit boards, to cope with the deformation or the damage caused by an external impact, and to help efficient transfer of a signal and/or power between the two printed circuit boards.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
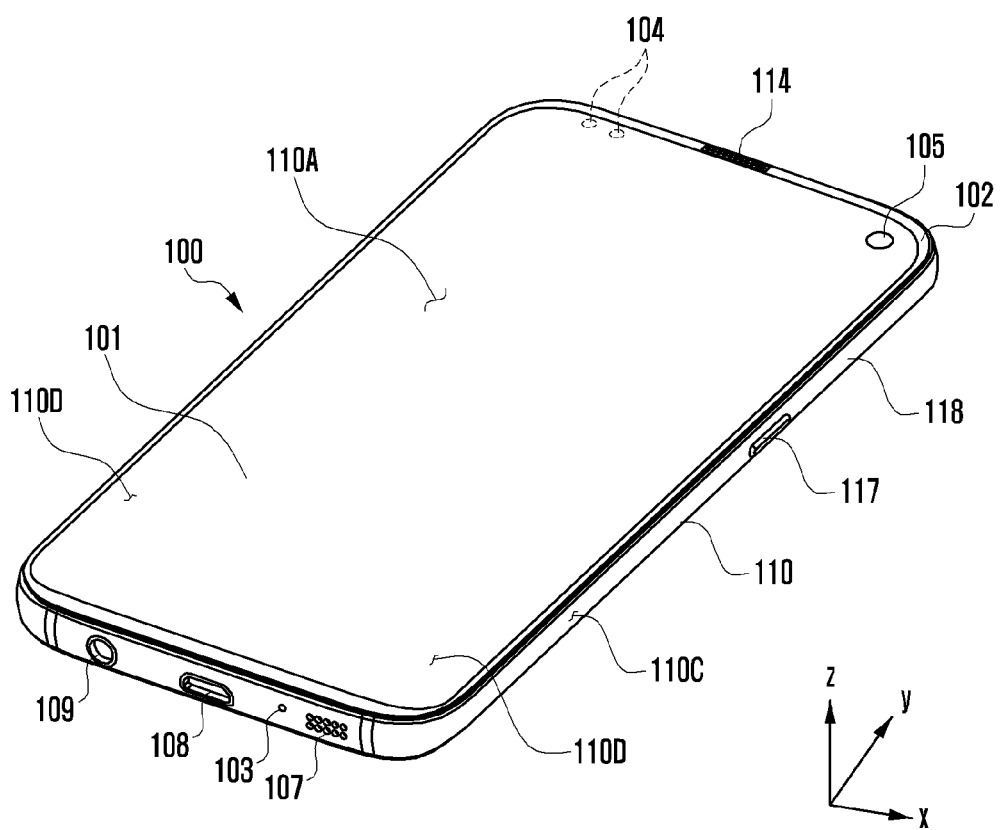
FIG. 1 is a perspective view of a front surface of a mobile electronic device according to an embodiment of the disclosure.
Figure 2:
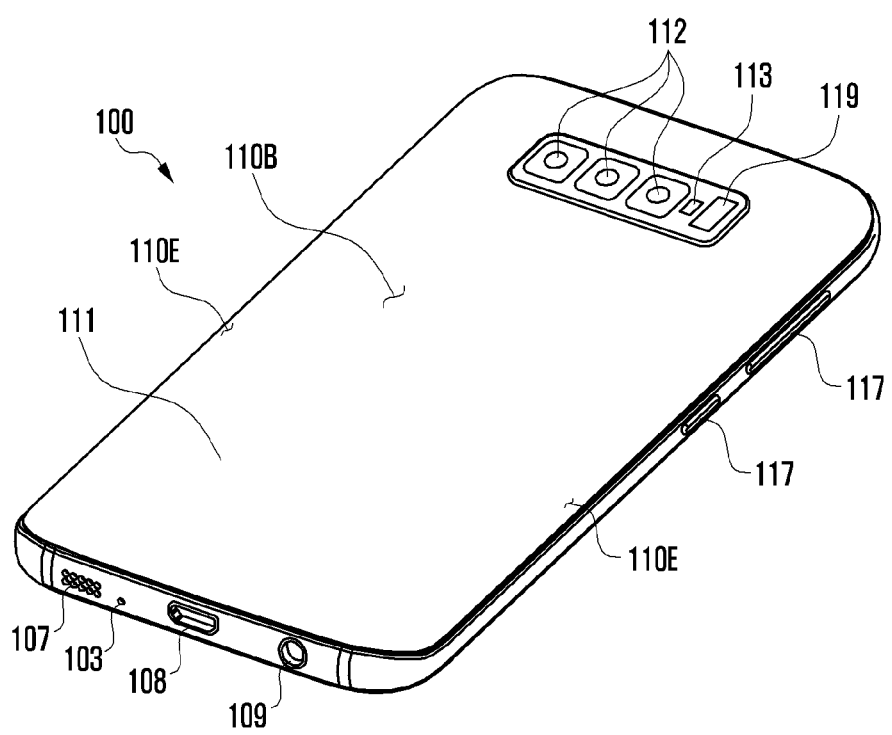
FIG. 2 is a perspective view of a rear surface of the mobile electronic device of FIG. 1 according to an embodiment of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first regions 110D or the second regions 110E are not included, and may have a second thickness, being less than the first thickness, on another lateral side where the first regions 110D or the second regions 110E are included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first regions 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first regions 110D and/or the second regions 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The mobile electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the mobile electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the mobile electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the mobile electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through the display 101. For example, the camera module 105, the sensor module 104, or the indicator may be arranged in the internal space of the mobile electronic device 100 so as to be brought into contact with an external environment through an opening of the display 101, which is perforated up to the front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
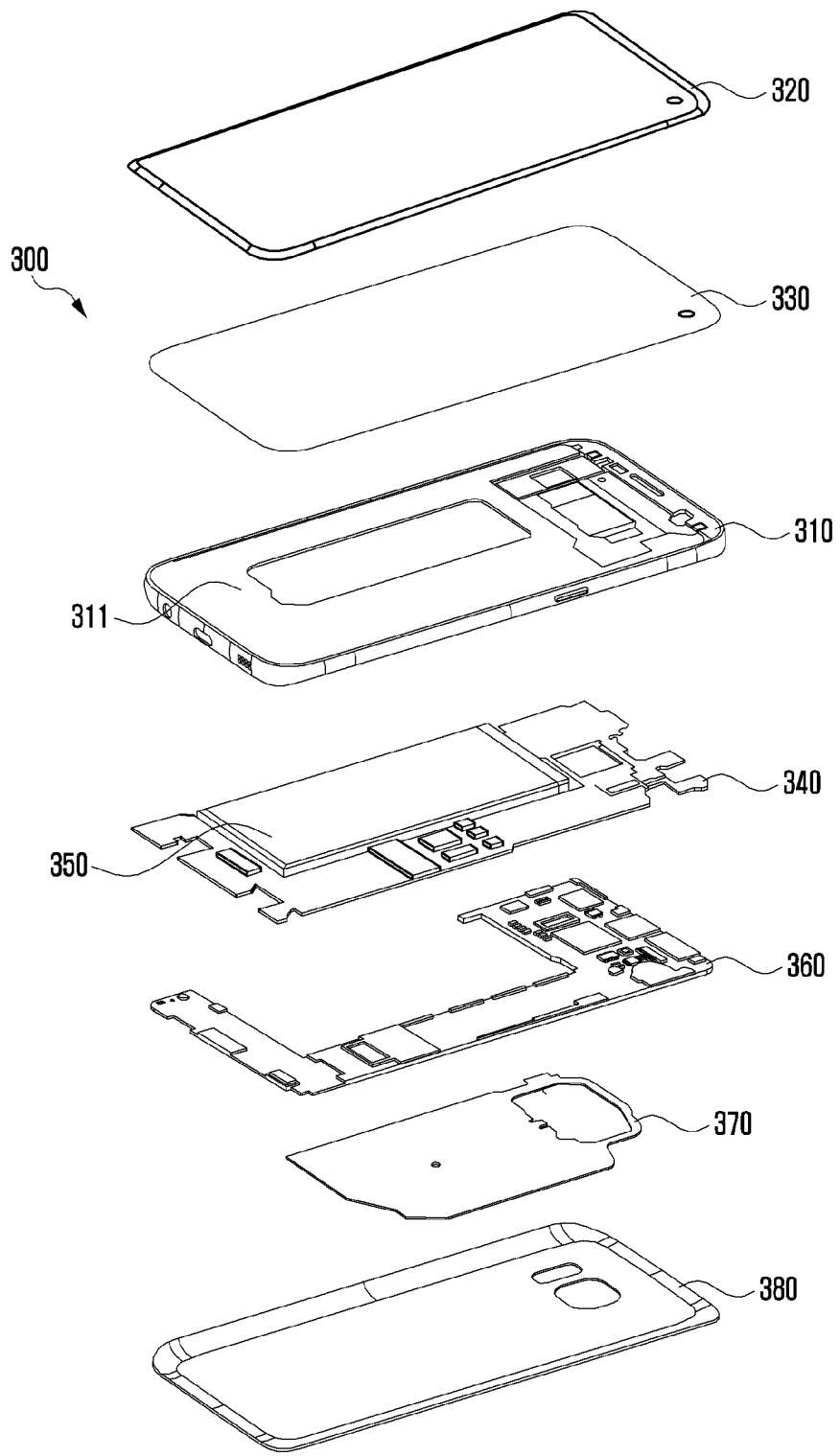
FIG. 3 is an exploded perspective view of the mobile electronic device of FIG. 1 according to an embodiment of the disclosure.

FIG. 3 illustrates an exploded perspective view showing a mobile electronic device shown in FIG. 1 according to an embodiment of the disclosure.

A mobile electronic device 300 in FIG. 3 may be at least partially similar to the mobile electronic device 100 in FIG. 1 and FIG. 2 or may further include other embodiments.

Referring to FIG. 3, a mobile electronic device 300 may include a lateral member 310 (e.g., lateral bezel structure 118 of FIG. 1), a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the mobile electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral member 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral member 310 and/or the first support member 311.

Figure 4:
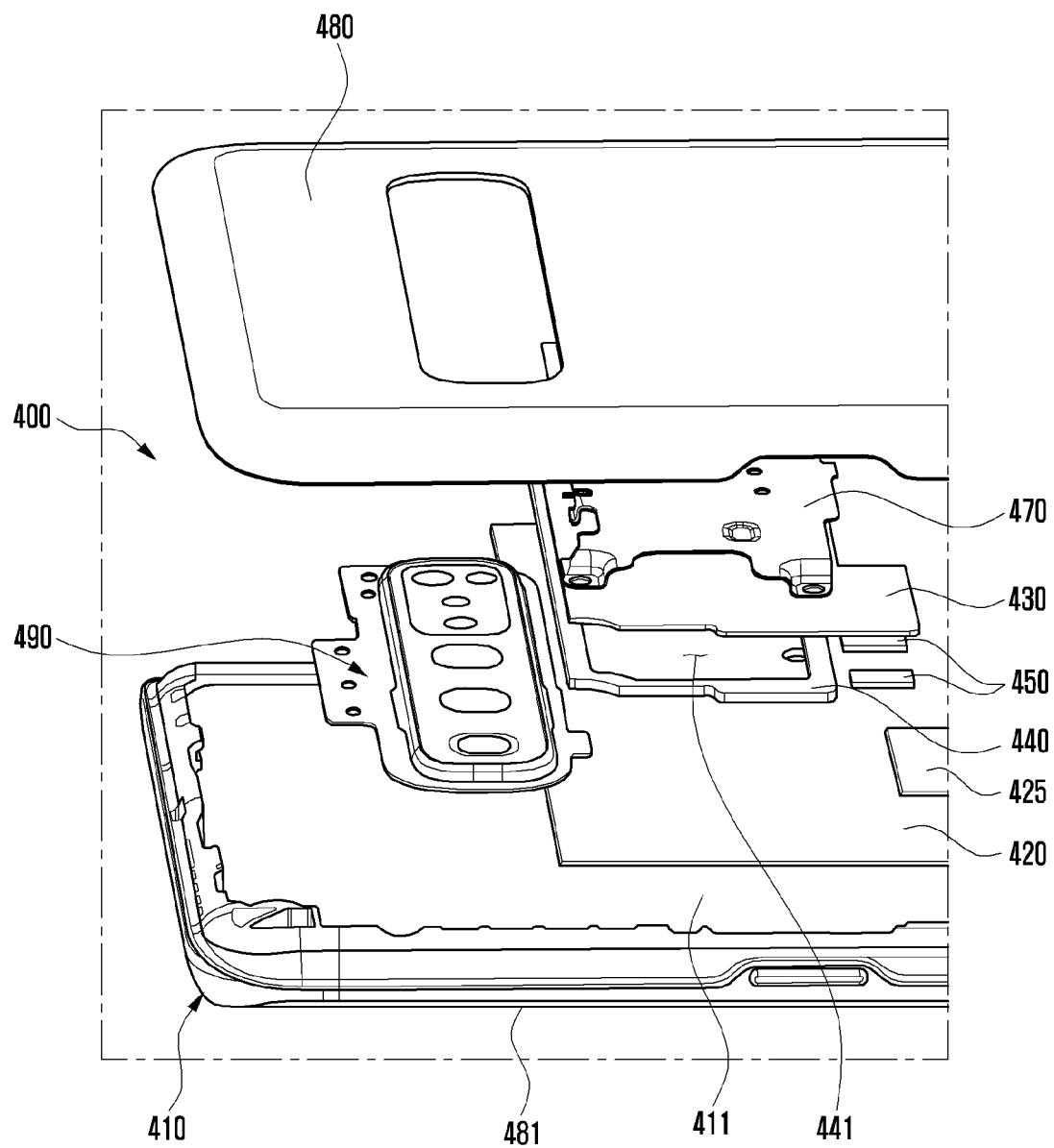
FIG. 4 is a separated perspective view of an electronic device to which interposers are applied according to an embodiment of the disclosure.

FIG. 4 is a separated perspective view of an electronic device to which interposers are applied according to an embodiment of the disclosure.

An electronic device 400 of FIG. 4 may be at least partly similar to the mobile electronic device 100 of FIGS. 1 and 2 or the mobile electronic device 300 of FIG. 3, or may include other embodiments of the electronic device.

Referring to FIG. 4, an electronic device 400 (e.g., mobile electronic device 300 of FIG. 3) may include a housing (e.g., the housing 110 of FIG. 1) including a front cover 481 (e.g., front plate 320 of FIG. 3), a rear cover 480 (e.g., rear plate 380 of FIG. 3) facing in an opposite direction to the direction of the front cover 481, and a side frame 410 (e.g., lateral bezel structure 118 of FIG. 1 or lateral member 310 of FIG. 3) surrounding a space between the front cover 481 and the rear cover 480. According to an embodiment, the electronic device 400 may include a first support member 411 (e.g., first support member 311 of FIG. 3) disposed in an inner space thereof. According to an embodiment, the first support member 411 may be disposed to be extended from the side frame 410 to the inner space. As another embodiment, the first support member 411 may be separately provided in the inner space of the electronic device 400. According to an embodiment, the first support member 411 may be extended from the side frame 410, and at least a partial area thereof may be formed of a conductive material. According to an embodiment, the electronic device 400 may further include a camera structure 490 disposed in a space between the front cover 481 and the rear cover 480.

According to various embodiments, the electronic device 400 may include a pair of printed circuit boards 420 and 430 (e.g., boards) disposed between the first support member 411 and the rear cover 480. According to an embodiment, when the front cover 481 is viewed from above, the pair of printed circuit boards 420 and 430 may be disposed so that at least partial areas thereof overlap each other. According to an embodiment, the pair of printed circuit boards 420 and 430 may include a first printed circuit board 420 (e.g., main board or first board) disposed between the first support member 411 and the rear cover 480, and a second printed circuit board 430 (e.g., sub-board or second board) disposed between the first printed circuit board 420 and the rear cover 480. For example, the first printed circuit board 420 may be a main board, and may be formed larger than the second printed circuit board 430 that is the sub-board when the front cover 481 is viewed from above. In a certain embodiment, when the front cover 481 is viewed from above, the first printed circuit board 420 may be formed with the same size as the size of the second printed circuit board 430. In a certain embodiment, when the front cover 481 is viewed from above, the first printed circuit board 420 may be formed smaller than the second printed circuit board 430.

According to various embodiments, the electronic device 400 may include interposers 440 and 450 (e.g., interposers) interposed between the first printed circuit board 420 and the second printed circuit board 430. According to an embodiment, the interposers 440 and 450 may include a plurality of conductive terminals, and may electrically connect the two printed circuit boards 420 and 430 to each other in a manner that the conductive terminals of the interposers 440 and 450 come in physical contact with the conductive terminals disposed between the two printed circuit boards 420 and 430. For example, the interposers 440 and 450 may be first mounted on the first printed circuit board 420 through a pre-solder that is applied to the conductive terminal. As another embodiment, the interposers 440 and 450 may be first mounted on the second printed circuit board 430 through a pre-solder that is applied to the conductive terminal. According to an embodiment, the electronic device 400 may include a second support member 470 disposed between the second printed circuit board 430 and the rear cover 480. According to an embodiment, the second support member 470 may be disposed at a location overlapping the second printed circuit board 430 at least partly. According to an embodiment, the second support member 470 may include a metal plate. Accordingly, the first printed circuit board 420, the interposers 440 and 450, and the second printed circuit board 430 may be fixed to the first support member 411 through the second support member 470 disposed on an upper side thereof. For example, the second support member 470 may firmly support electrical connections among the first printed circuit board 420, the interposers 440 and 450, and the second printed circuit board 430 by being fastened to the first support member 411 through a fastening member, such as a screw. As another embodiment, the first printed circuit board 420, the interposers 440 and 450, and the second printed circuit board 430 may be disposed in the inner space of the electronic device 400 without the second support member 470.

According to various embodiments, the interposers 440 and 450 may include a first interposer 440 including a first opening 441 and at least one second interposer 450 disposed around the first interposer 440. According to an embodiment, the at least one second interposer 450 may be disposed to overlap a part that is not covered by the first interposer 440 depending on the shape of the second printed circuit board 430. According to an embodiment, the second printed circuit board 430 disposed to overlap the first printed circuit board 420 may be formed in various shapes depending on the disposition structure of neighboring electronic components (e.g., battery or camera module). For example, the second printed circuit board 430 may include a protrusion part (e.g., protrusion part 4301 of FIG. 5) protruding in a specific area depending on the disposition structure of the neighboring electronic components, and in response to this, in case that the first interposer 440 is formed to include the protrusion part between the first printed circuit board 420 and the second printed circuit board 430, the corresponding part may be damaged due to an external impact, such as when the electronic device is dropped. Accordingly, a stiffness reinforcement structure capable of enduring an external impact, such as dropping of the electronic device 400, may be provided by disposing the at least one second interposer 450 between an area corresponding to the protrusion part of the second printed circuit board 430 and the first printed circuit board, separately from the first interposer.

According to various embodiments, the interposers 440 and 450 may be formed as one layer, or may be formed as a plurality of layers.

According to various embodiments, the first printed circuit board 420 may include at least one first electrical element 425 disposed in an area except the area on which the first interposer 440 is stacked on the first printed circuit board 420. According to an embodiment, when the first printed circuit board is viewed from above, the second printed circuit board 430 may include at least one second electrical element (e.g., at least one second electrical element 463 and 464 of FIG. 13B) disposed at a location overlapping the first opening 441. In a certain embodiment, in case that the at least one first electrical element 425 is electrically connected to the at least one second electrical element 463 and 464, it may be possible to shorten an electrical connection path between the two electrical elements (e.g., first electrical element 425 and the second electrical elements 463 and 464) through a part of another interposer (e.g., second interposer 540 of FIG. 13A) disposed inside the first opening 441.

Hereinafter, the disposition configuration of the interposers 440 and 450 will be described in detail.

Figure 5:
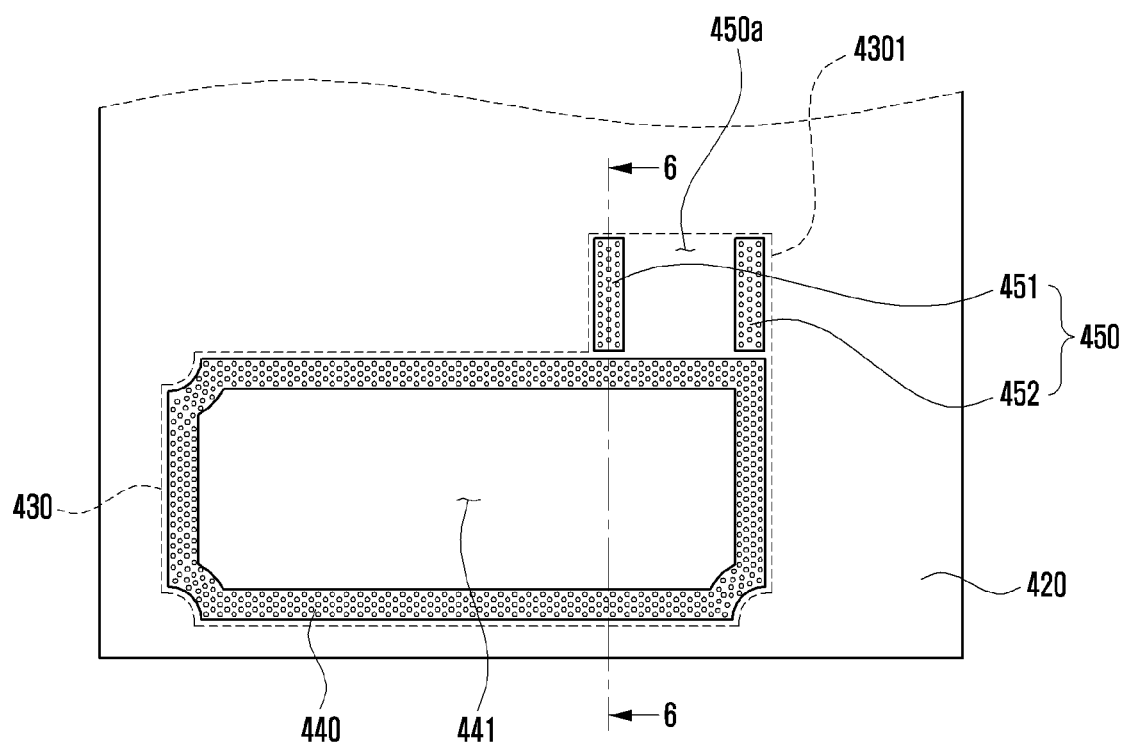
FIG. 5 is a view illustrating a state where interposers are disposed between two printed circuit boards according to an embodiment of the disclosure.
Figure 6:
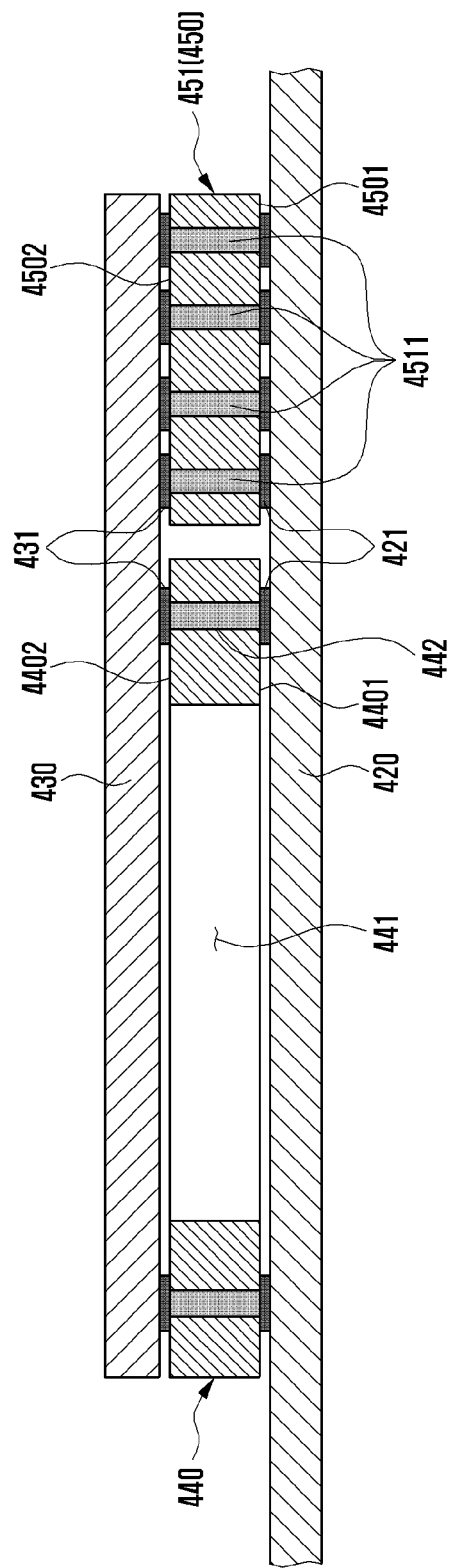
FIG. 6 is a cross-sectional view taken along line 6-6 of FIG. 5 according to an embodiment of the disclosure.

FIG. 5 is a view illustrating a state where interposers are disposed between two printed circuit boards according to an embodiment of the disclosure. FIG. 6 is a cross-sectional view taken along line 6-6 of FIG. 5 according to an embodiment of the disclosure.

Referring to FIG. 5, an electronic device (e.g., electronic device 400 of FIG. 4) may include a first printed circuit board 420, a second printed circuit board 430 disposed spaced apart from the first printed circuit board 420 to overlap the first printed circuit board 420, and interposers 440 and 450 disposed between the first printed circuit board 420 and the second printed circuit board 430. According to an embodiment, the interposers 440 and 450 may include a first interposer 440 including the first opening 441 and a second interposer 450 disposed around the first interposer 440. According to an embodiment, the first opening 441 may be formed in a closed loop shape through the first interposer 440. In a certain embodiment, the first opening 441 may be formed in at least partly opened loop shape through the second interposer 450.

According to various embodiments, the second interposer 450 may be disposed to support a protrusion part 4301 that protrudes at least partly of the second printed circuit board 430. According to an embodiment, the second interposer 450 may have various disposition configurations for supporting the protrusion part 4301 between the first printed circuit board 420 and the second printed circuit board 430. For example, as illustrated, when the first printed circuit board 420 is viewed from above, the second interposer 450 may include a first sub-board 451 disposed in a partial area of the protrusion part 4301 and a second sub-board 452 disposed at a location facing the first sub-board 451 in an area overlapping the protrusion part 4301 of the second printed circuit board 430. According to an embodiment, the second interposer 450 may be disposed so as to have an opening 450*a* connected to an outside (e.g., outside of an area in which the second printed circuit board 430 overlaps the first printed circuit board 420) through the first sub-board 451 and the second sub-board 452 in the area overlapping the protrusion part 4301. In a certain embodiment, the second interposer 450 may include three or more sub-boards disposed so as to close the opening 450*a* in the area overlapping the protrusion part 4301. In a certain embodiment, the second interposer 450 may be replaced by one rectangular-shaped interposer disposed so as to close the opening 450*a* in the area overlapping the protrusion part 4301. In a certain embodiment, the second interposer 450 may include the second sub-board 452 disposed at a location crossing the first sub-board 451.

Referring to FIG. 6, a first interposer 440 may include a first board surface 4401 facing the first printed circuit board 420 and a second board surface 4402 facing the second printed circuit board 430. According to an embodiment, the first interposer 440 may include a plurality of first conductive vias 442 (e.g., conductive posts) disposed so as to penetrate from the first board surface 4401 to the second board surface 4402. According to an embodiment, the plurality of first conductive vias 442 may be disposed to be exposed to the first board surface 4401 and the second board surface 4402. According to an embodiment, the first sub-board 451 of the second interposer 450 may include a third board surface 4501 facing the first printed circuit board 420 and a fourth board surface 4502 facing the second printed circuit board 430. According to an embodiment, the first sub-board 451 may include a plurality of second conductive vias 4511 (e.g., conductive posts) disposed so as to penetrate from the third board surface 4501 to the fourth board surface 4502. Although not illustrated, the second sub-board (second sub-board 452 of FIG. 5) may include a plurality of conductive vias disposed in the same manner.

According to various embodiments, the first interposer 440 may include the plurality of first conductive vias 442 (e.g., conductive posts) disposed so as to be filled with a conductive material (e.g., copper, nickel, or tin) from the first board surface 4401 to the second board surface 4402.

According to various embodiments, in case that the first interposer 440 and the second interposer 450 are disposed between the first printed circuit board 420 and the second printed circuit board 430, a plurality of first conductive terminals 421 of the first printed circuit board 420 may be electrically connected to the plurality of first conductive vias 442 exposed to the first board surface 4401 of the first interposer 440 and the plurality of second conductive vias 4511 exposed to the third board surface 4501 of the first sub-board 451 by coming in physical contact with them. In the same manner, a plurality of second conductive terminals 431 of the second printed circuit board 430 may be electrically connected to the plurality of first conductive vias 442 exposed to the second board surface 4402 of the first interposer 440 and the plurality of second conductive vias 4511 exposed to the fourth board surface 4502 of the first sub-board 451 by coming in physical contact with them.

According to various embodiments, the plurality of first conductive vias 442 and the plurality of second conductive vias 4511 may be used as power lines and/or signal lines.

According to an embodiment of the disclosure, the electronic device (e.g., electronic device 400 of FIG. 4) includes the second interposer 450 separately disposed in the area (e.g., protrusion part 4301) that is unable to be covered by the first interposer 440 in response to various shapes of the second printed circuit board 430, and thus can help to prevent the damage of the interposer due to an external impact or the deformation, such as bending, of the second printed circuit board 430.

Hereinafter, in explaining various disposition configurations of the interposers, the same reference numerals may be given to substantially the same constituent elements as those in FIG. 5, and the detailed explanation thereof may be omitted.

Figure 7:
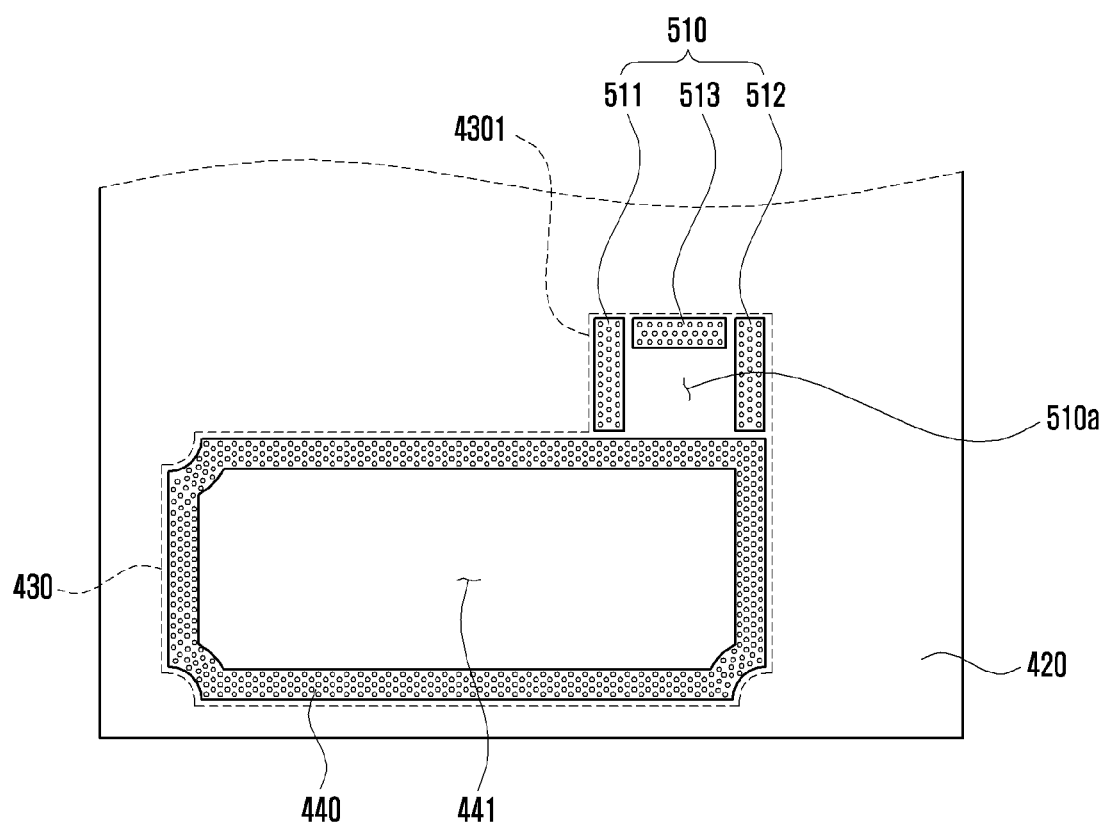
FIG. 7 is a view illustrating a state where interposers are disposed between two printed circuit boards according to an embodiment of the disclosure.

FIG. 7 is a view illustrating a state where interposers are disposed between two printed circuit boards according to an embodiment of the disclosure.

Referring to FIG. 7, an electronic device (e.g., electronic device 400 of FIG. 4) may include a first printed circuit board 420, a second printed circuit board 430 disposed to overlap the first printed circuit board 420, and interposers 440 and 510 disposed between the first printed circuit board 420 and the second printed circuit board 430.

According to various embodiments, the second interposer 510 may include a first sub-board 511, a second sub-board 512, and a third sub-board 513, which are disposed to neighbor one another. According to an embodiment, the second interposer 510 may have a second opening 510*a* surrounding the opening (e.g., opening 450*a* of FIG. 5) in an area corresponding to the protrusion part 4301 of the second printed circuit board 430. In this case, the first opening 441 having a loop structure of the first interposer 440 and the second opening 510*a* surrounded by the second interposer 510 require electrical shielding, and may accommodate various electrical elements mounted on the first printed circuit board 420 and/or the second printed circuit board 430. In a certain embodiment, the first opening 441 of the first interposer 440 may be formed in a closed loop structure.

According to various embodiments, in the area corresponding to the protrusion part 4301 of the second printed circuit board 430, the second interposer 510 may form a wall including the second opening 510*a* with the first sub-board 511, the second sub-board 512, and the third sub-board 513. For example, the first sub-board 511, the second sub-board 512, and the third sub-board 513 may form a wall in a rectangular or loop shape (or structure). The first sub-board 511, the second sub-board 512, and the third sub-board 513 may be disposed to be spaced apart from one another at designated intervals (e.g., 1 mm). In a certain embodiment, the second opening 510*a* formed through the first sub-board 511, the second sub-board 512, and the third sub-board 513 may contribute as a shield wall for the electrical elements disposed inside the second opening 510*a*. In this case, the disposition intervals of the first sub-board 511, the second sub-board 512, and the third sub-board 513 may be determined within a range where a shielding action for shielding the electrical elements can be smoothly performed.

Figure 8:
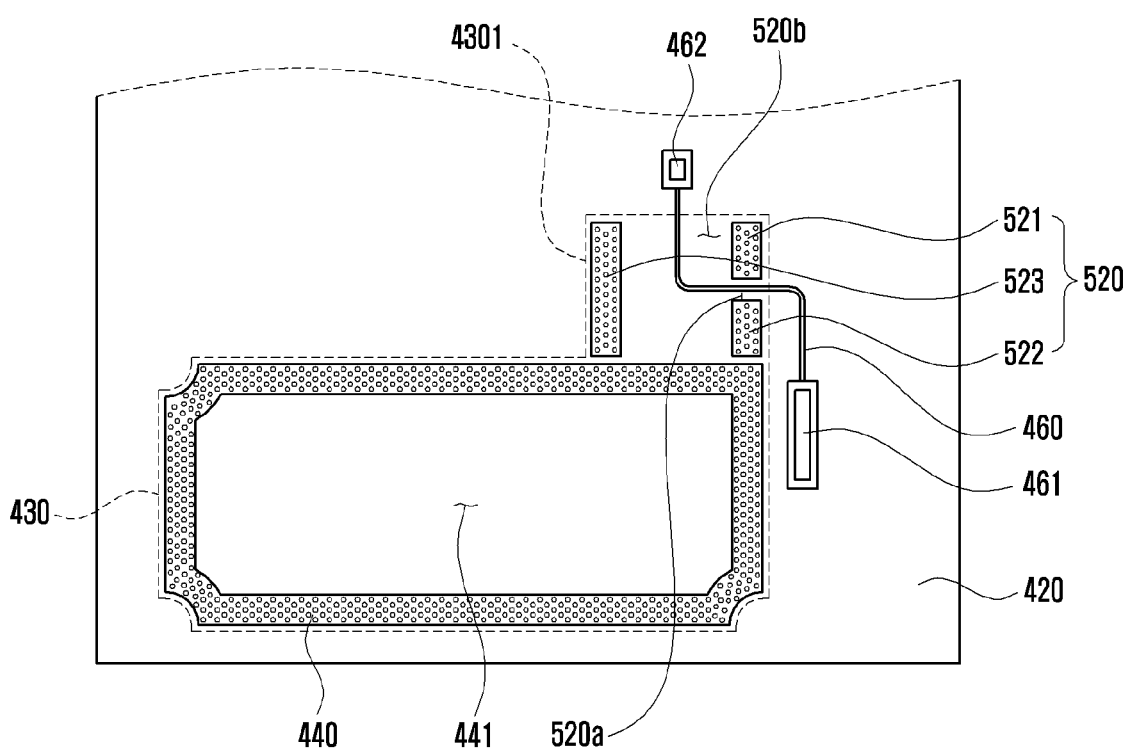
FIG. 8 is a view illustrating an electrical connection member that passes through an interposer between two printed circuit boards according to an embodiment of the disclosure.

FIG. 8 is a view illustrating an electrical connection member that passes through an interposer between two printed circuit boards according to an embodiment of the disclosure.

Referring to FIG. 8, a second interposer 520 may include a plurality of sub-boards 521, 522, and 523 disposed in an area corresponding to a protrusion part 4301 overlapping a first printed circuit board 420 and formed as a part of a second printed circuit board 430. According to an embodiment, the second interposer 520 may include a first sub-board 521 and a second sub-board 522 forming a first opening 520*a* connected to the outside (outside of an area in which the second printed circuit board 430 overlaps the first printed circuit board 420), by being disposed spaced apart from each other, in the area overlapping the protrusion part 4301 of the second printed circuit board 430. According to an embodiment, the second interposer 520 may include a third sub-board 523 forming a second opening 520*b* connected to the outside, by being disposed spaced apart from the first sub-board 521, in the area overlapping the protrusion part 4301 of the second printed circuit board 430. According to an embodiment, the second interposer 520 may provide a passage of the electrical connection member that should be bypassed depending on the disposition of the second printed circuit board 430 and/or the first printed circuit board 420, through the first opening 520*a* and the second opening 520*b*, in the area overlapping the protrusion part 4301. For example, when the first printed circuit board 420 is viewed from above, an electrical connection member 460 may include a flexible board (e.g., flexible printed circuit board (FPCB), coaxial cable, or FPCB type radio frequency (RF) cable (FRC)) for electrically connecting a first electrical connector 461 disposed at a first location that does not overlap the second printed circuit board 430 to a second electrical connector 462 disposed at a second location.

The second interposer 520 according to an embodiment of the disclosure provides the passage of the external electrical connection member 460, and can help efficient component design and slimming of the electronic device (e.g., electronic device 400 of FIG. 4).

FIGS. 9, 10, 11, and 12 are views illustrating a state where interposers are disposed between two printed circuit boards according to various embodiments of the disclosure.

Figure 9:
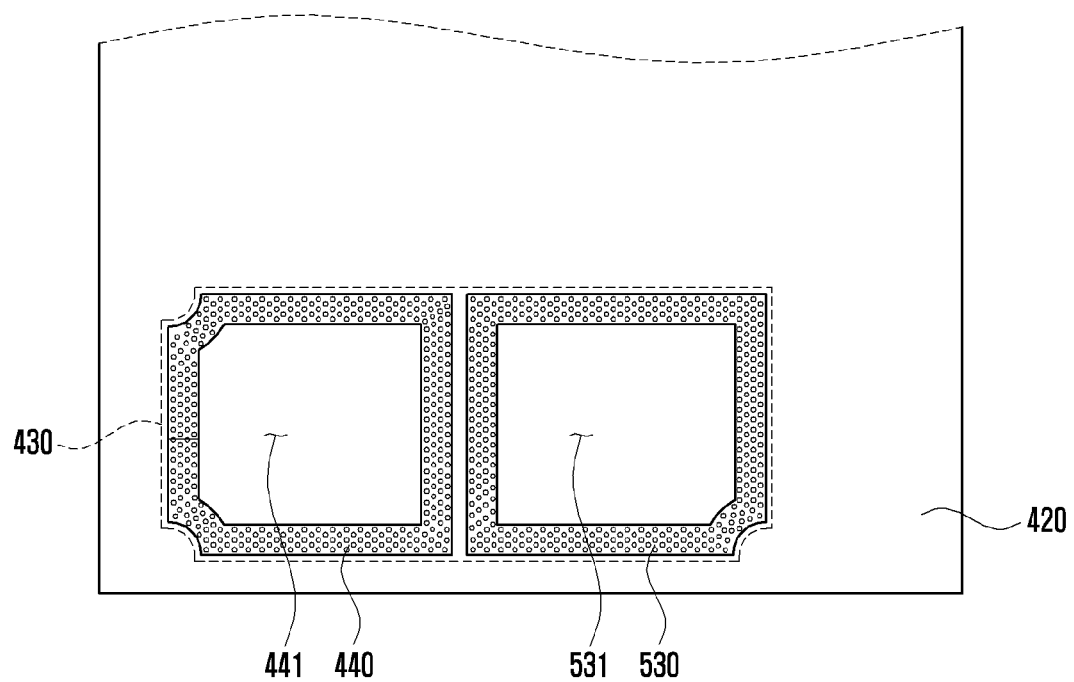
FIGS. 9, 10, 11, and 12 are views illustrating a state where interposers are disposed between two printed circuit boards according to various embodiments of the disclosure.

Referring to FIG. 9, an electronic device (e.g., electronic device 400 of FIG. 4) may include a first printed circuit board 420, a second printed circuit board 430 disposed to overlap the first printed circuit board 420, and interposers 440 and 530 disposed between the first printed circuit board 420 and the second printed circuit board 430. According to an embodiment, when the first printed circuit board 420 is viewed from above, the interposers 440 and 530 may be disposed at a location overlapping at least the second printed circuit board 430.

According to various embodiments, when the first printed circuit board 420 is viewed from above, the interposers 440 and 530 may include a first interposer 440 and a second interposer 530 disposed in parallel to each other in the area overlapping the second printed circuit board 430. According to an embodiment, the first interposer 440 may include the first opening 441 having a loop structure. According to an embodiment, the second interposer 530 may include a second opening 531 having a loop structure. According to an embodiment, the first interposer 440 and the second interposer 530 may be formed in the same shape or in different shapes from each other. In a certain embodiment, the first interposer 440 and/or the second interposer 530 may be formed in at least partly opened loop shape.

Figure 10:
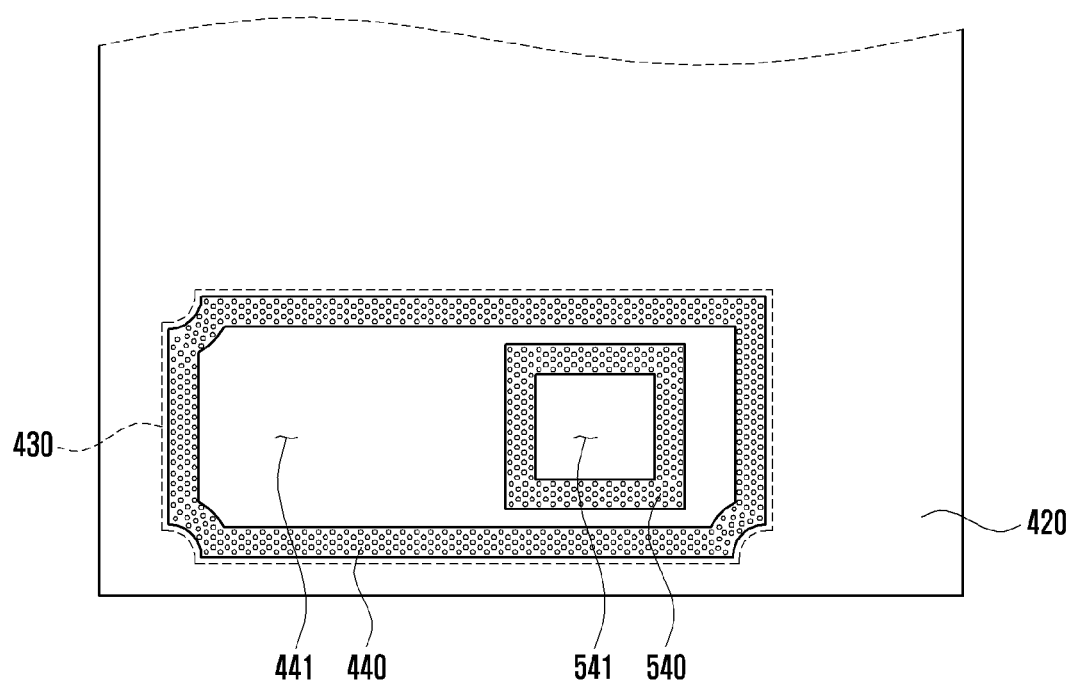

Referring to FIG. 10, when the first printed circuit board 420 is viewed from above, interposers 440 and 540 may include a first interposer 440 disposed in the area overlapping the second printed circuit board 430 and including the first loop-shaped opening 441, and a second interposer 540 disposed at a location overlapping the first opening 441 of the first interposer 440. According to an embodiment, the second interposer 540 may include a second opening 541 having a loop structure at a location overlapping the first opening 441. In a certain embodiment, the second interposer 540 may be formed in at least partly opened loop shape.

Figure 11:
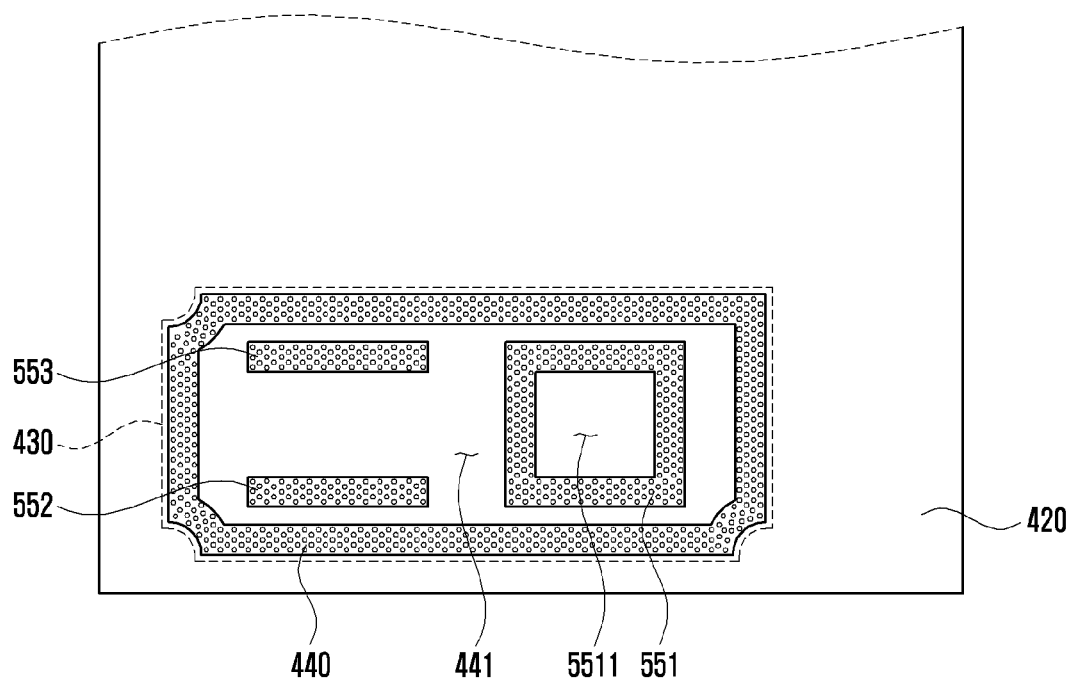

Referring to FIG. 11, when the first printed circuit board 420 is viewed from above, interposers 440, 551, 552, and 553 may include the first interposer 440 disposed in the area overlapping the second printed circuit board 430 and including the first loop-shaped opening 441, the second interposer 540 disposed in a partial area overlapping the first opening 441 of the first interposer 440, a third interposer 552 and a fourth interposer 553 disposed spaced apart from a second interposer 551 in the partial area overlapping the first opening 441 of the first interposer 440. According to an embodiment, the second interposer 551 may include a second opening 5511 having a loop structure at the location overlapping the first opening 441. According to an embodiment, the third interposer 552 and the fourth interposer 553 may be formed in an individual bar type shape.

Figure 12:
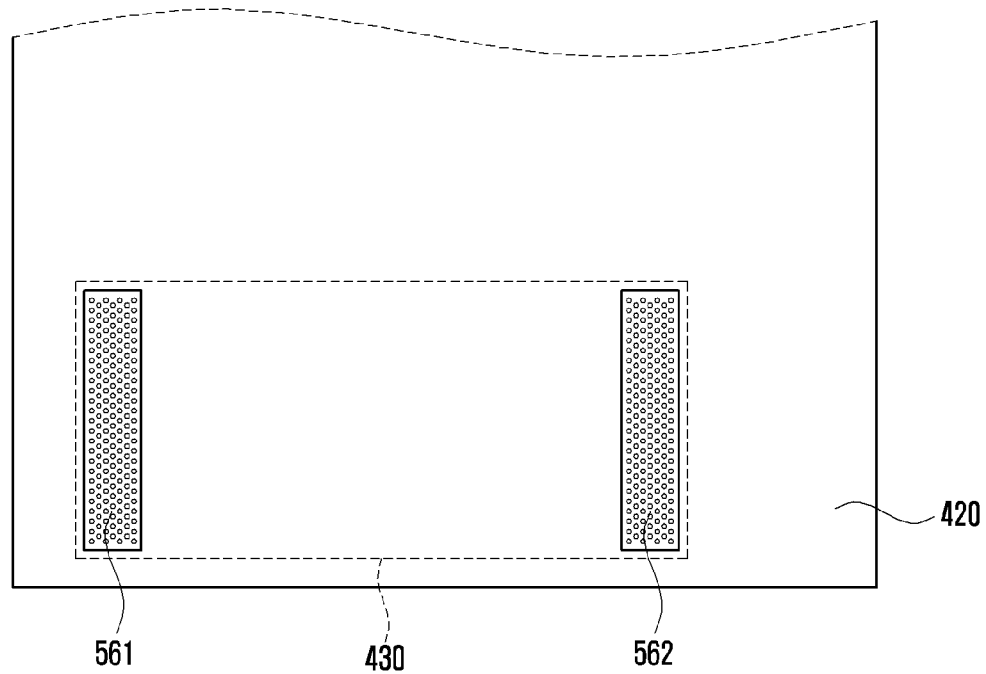

Referring to FIG. 12, when the first printed circuit board 420 is viewed from above, interposers 561 and 562 may include a first interposer 561 disposed at one end and a second interposer 562 disposed at the other end in the area overlapping the second printed circuit board 430. According to an embodiment, the first interposer 561 and the second interposer 562 may be formed in individual bar types, and may be disposed at a favorable location to support the second printed circuit board 430 between the first printed circuit board 420 and the second printed circuit board 430. For example, the first interposer 561 and the second interposer 562 may be disposed at both corners of the second printed circuit board 430. In a certain embodiment, the interposers 561 and 562 may include three or more interposers disposed individually from one another.

The interposers 450, 510, 520, 530, 540, 551, 552, 553, 561, and 562 according to various embodiments of the disclosure may be disposed side by side in the area overlapping the second printed circuit board 430, or may be disposed so as to have various shapes at the location overlapping the first opening 441. Since the interposers support the second printed circuit board 430 at designated locations, stiffness enough to endure an external impact can be provided.

Figure 13A:
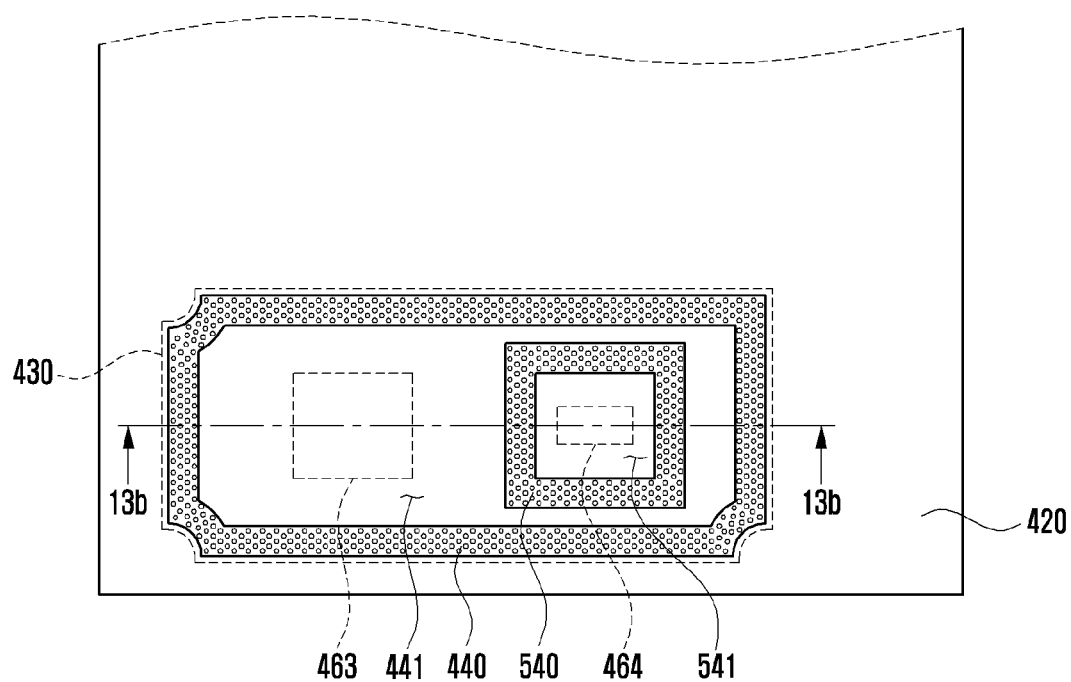
FIG. 13A is a view illustrating a state where electrical elements are disposed through an interposer between two printed circuit boards according to an embodiment of the disclosure.
Figure 13B:
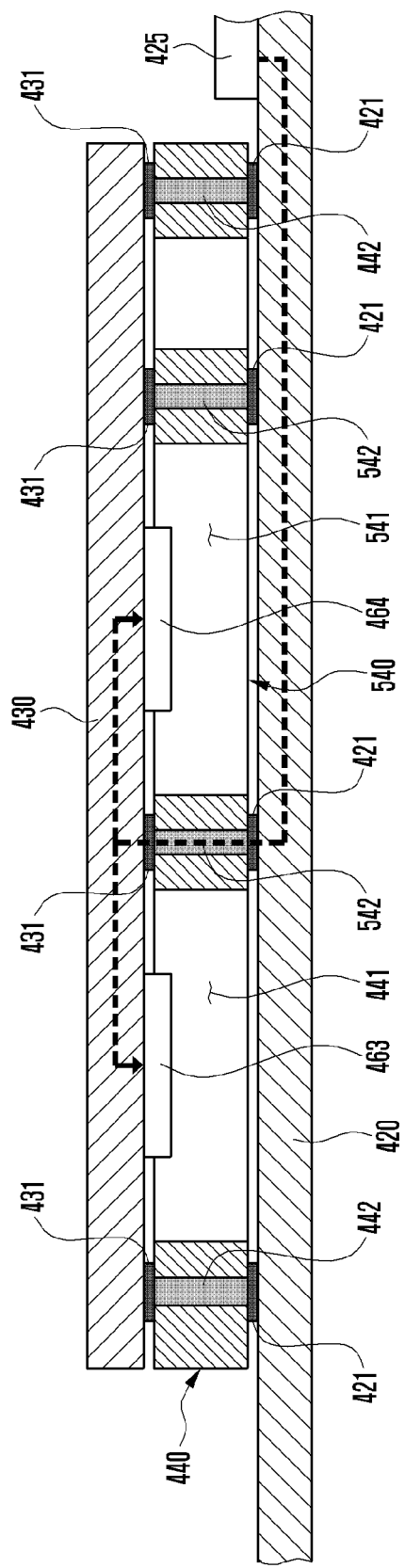
FIG. 13B is a cross-sectional view taken along line 13b-13b of FIG. 13A according to an embodiment of the disclosure.

FIG. 13A is a view illustrating a state where second electrical elements are disposed through interposers between two printed circuit boards according to an embodiment of the disclosure. FIG. 13B is a cross-sectional view taken along line 13b-13b of FIG. 13A according to an embodiment of the disclosure.

Referring to FIGS. 13A and 13B, when a first printed circuit board 420 is viewed from above, interposers 440 and 540 may include a first interposer 440 disposed in the area overlapping the second printed circuit board 430 and including a first loop-shaped opening 441, and a second interposer 540 disposed at the location overlapping the first opening 441 of the first interposer 440. According to an embodiment, the second interposer 540 may include the second opening 541 having a loop structure in the area overlapping the first opening 441.

According to various embodiments, the first printed circuit board 420 may include at least one first electrical element 425. According to an embodiment, when the first printed circuit board is viewed from above, the second printed circuit board 430 may include at least one second electrical elements 463 and 464 disposed at the location overlapping the first opening 441 and at the location overlapping the second opening 541. According to an embodiment, in case that the at least one first electrical element 425 is electrically connected to the at least one second electrical element 463 and 464, the electrical connection path between the two electrical elements 425, 463 and 464) can be shortened through a part of the second interposer 540 disposed inside the first opening 441. For example, the at least one first electrical element 425 may be electrically connected to the at least one second electrical element 463 and 464 through a plurality of second conductive vias 542 of the second interposer 540 disposed to overlap the first opening 441. According to an embodiment, the at least one first electrical element 425 and/or the at least one second electrical element 463 and 464 may include at least one of a power management integrated circuit (PMIC), a radio frequency integrated circuit (RFIC), or a processor (e.g., an application processor (AP) and/or a communication processor (CP)).

Figure 14A:
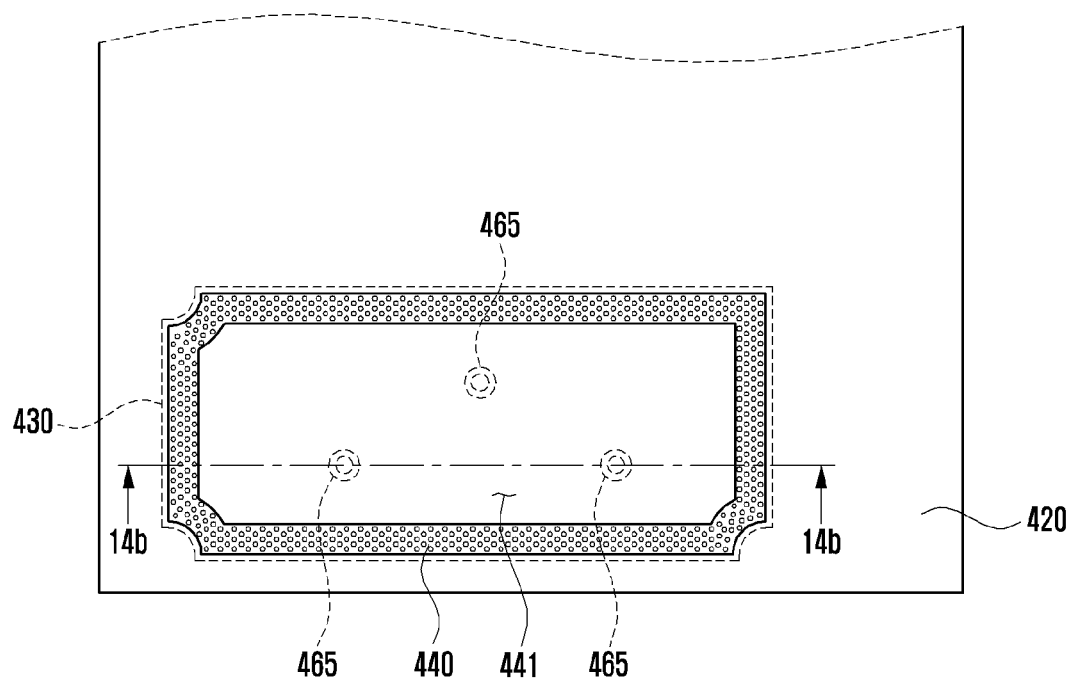
FIG. 14A is a view illustrating a state where supports are disposed through an interposer between two printed circuit boards according to an embodiment of the disclosure.
Figure 14B:
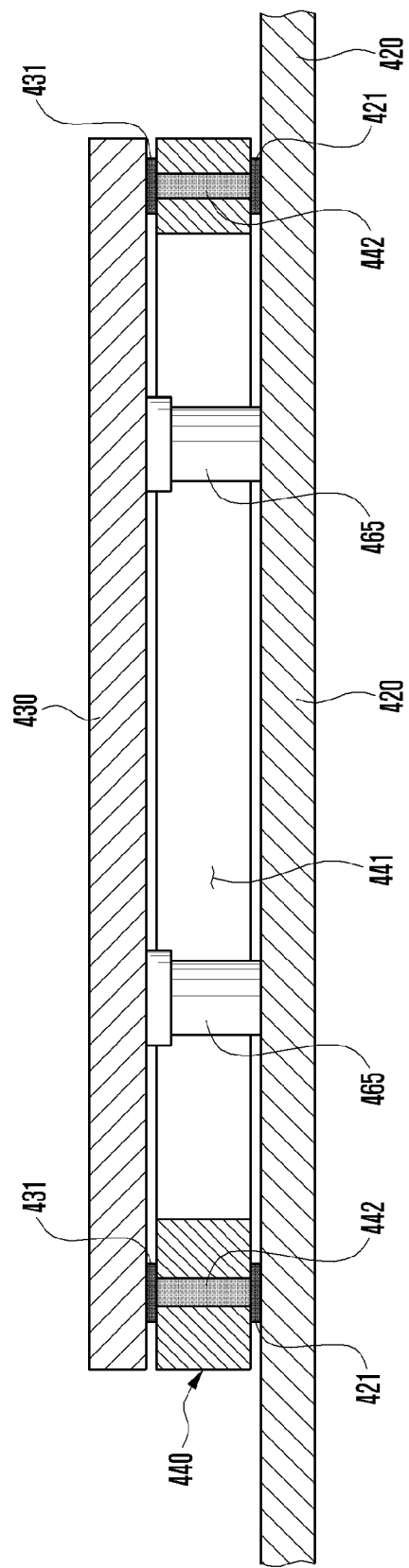
FIG. 14B is a cross-sectional view taken along line 14b-14b of FIG. 14A according to an embodiment of the disclosure.

FIG. 14A is a view illustrating a state where supports are disposed through an interposer between two printed circuit boards according to an embodiment of the disclosure. FIG. 14B is a cross-sectional view taken along line 14b-14b of FIG. 14A according to an embodiment of the disclosure.

Referring to FIGS. 14A and 14B, an electronic device (e.g., electronic device 400 of FIG. 4) may include a first printed circuit board 420, a second printed circuit board 430 disposed to overlap the first printed circuit board 420 at least partly, and a first interposer 440 disposed between the first printed circuit board 420 and the second printed circuit board 430. According to an embodiment, the first interposer 440 may be formed with substantially the same size as the size of the second printed circuit board 430, and may include the first opening 441 of a closed shape. Accordingly, if an external impact is applied to the electronic device (e.g., electronic device 400 of FIG. 4), the first printed circuit board 420 and/or the second printed circuit board 430 may be deformed, such as bending, or damaged due to the first opening 441 that occupies a relatively wide space between the first printed circuit board 420 and the second printed circuit board 430.

According to an embodiment of the disclosure, the electronic device (e.g., electronic device 400 of FIG. 4) may include at least one support 465 disposed in the area overlapping the first opening 441 between the first printed circuit board 420 and the second printed circuit board 430. According to an embodiment, the at least one support 465 may include a pan nut that comes in physical contact with outer surfaces of the first printed circuit board 420 and the second printed circuit board 430. In a certain embodiment, the support 465 may include a shield can provided to shield the electrical element mounted on the first printed circuit board 420 and/or the second printed circuit board 430. In a certain embodiment, since the support 465 is formed of a conductive material, it may be used to connect the ground of the first printed circuit board 420 and the second printed circuit board 430 (ground area extension), or may be used to transfer a power signal or a data signal.

According to various embodiments, the support 465 may be a chip-shaped component mounted on the first printed circuit board 420 and/or the second printed circuit board 430 in a surface mounted device (SMD) method.

Figure 15A:
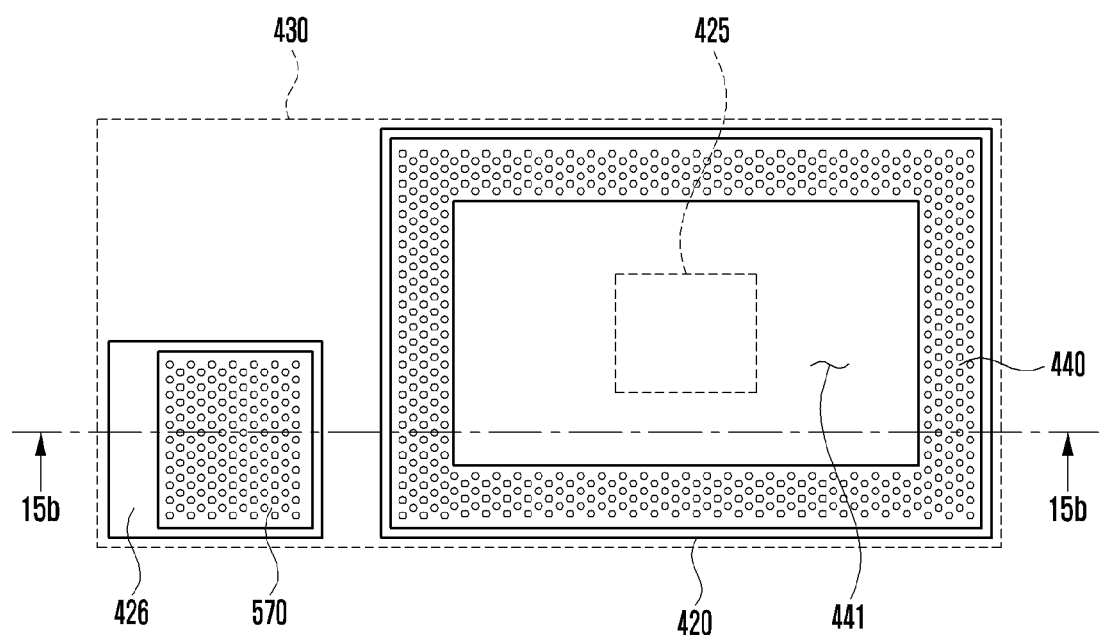
FIG. 15A is a view illustrating a state where interposers are disposed between printed circuit boards according to an embodiment of the disclosure.
Figure 15B:
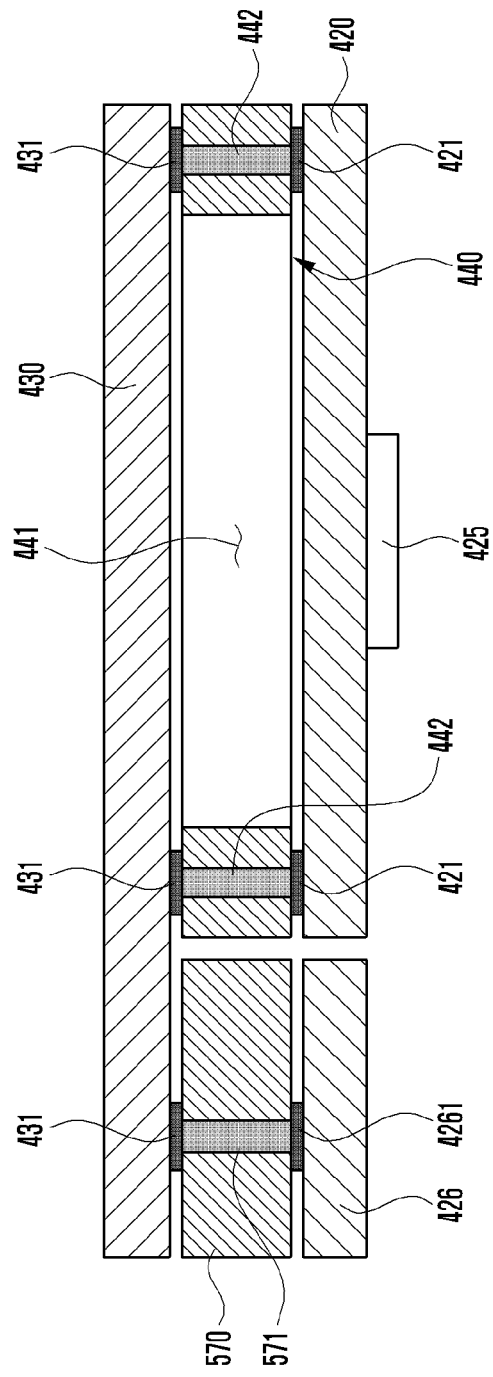
FIG. 15B is a cross-sectional view taken along line 15b-15b of FIG. 15A according to an embodiment of the disclosure.

FIG. 15A is a view illustrating a state where interposers are disposed between printed circuit boards (e.g., the first printed circuit board and the third printed circuit board, and the second printed circuit board) according to an embodiment of the disclosure. FIG. 15B is a cross-sectional view taken along line 15b-15b of FIG. 15A according to an embodiment of the disclosure.

Referring to FIGS. 15A and 15B, an electronic device (e.g., electronic device 400 of FIG. 4) may include a first printed circuit board 420, a second printed circuit board 430 disposed spaced apart from the first printed circuit board 420 at designated intervals, a third printed circuit board 426 (e.g., third board) disposed to overlap the first printed circuit board 420, and interposers 440 and 570 disposed between the first printed circuit board 420 and the third printed circuit board 426, and the second printed circuit board 430. According to an embodiment, the third printed circuit board 426 may be disposed on the same plane as the plane of the first printed circuit board 420. In a certain embodiment, the third printed circuit board 426 may be disposed in parallel to a different plane from the plane of the first printed circuit board 420 and the second printed circuit board 430. In this case, the first printed circuit board 420 may be formed with a smaller size than the size of the second printed circuit board 430. In a certain embodiment, when the second printed circuit board 430 is viewed from above, the first printed circuit board 420 and the third printed circuit board 426 may be disposed at the location overlapping the second printed circuit board 430.

According to various embodiments, when the second printed circuit board 430 is viewed from above, the interposers 440 and 570 may include the first interposer 440 including the first opening 441 disposed to overlap the first printed circuit board 420 between the first printed circuit board 420 and the second printed circuit board 430, and a second interposer 570 disposed to overlap at least a part of the third printed circuit board 426 on the third printed circuit board 426 and the second printed circuit board 430. According to an embodiment, the second interposer 570 may be electrically connected to a plurality of third conductive terminals 4261 of the third printed circuit board 426 through a plurality of conductive vias 571, and may be disposed to be electrically connected to the plurality of second conductive terminals 431 of the second printed circuit board 430. Accordingly, even if the second printed circuit board 430 is larger than the first printed circuit board 420, the second printed circuit board 430 is supported through the second interposer 570 that is supported by the third printed circuit board 426 disposed near the first printed circuit board 420, and thus the second printed circuit board 430 can be prevented from being deformed to be bent or from being damaged by the external impact. According to an embodiment, the second interposer 570 may be replaced by at least one of the above-described interposers 450, 510, 520, 530, 540, 551, 552, 553, 561, and 562.

According to various embodiments, the third printed circuit board 426 may include another sub-board disposed spaced apart from the first printed circuit board 420 at designated intervals. According to an embodiment, the third printed circuit board 426 is disposed spaced apart from the first printed circuit board 420 at the designated intervals, and thus may help an efficient electrical connection to an electronic component (e.g., antenna). For example, the third printed circuit board 426 or the electronic component (e.g., antenna) disposed nearby may be electrically connected to the electrical element (e.g., wireless communication circuit or processor) disposed on the first printed circuit board 420 through the first interposer 440, the second printed circuit board 430, and the second interposer 570.

Figure 16:
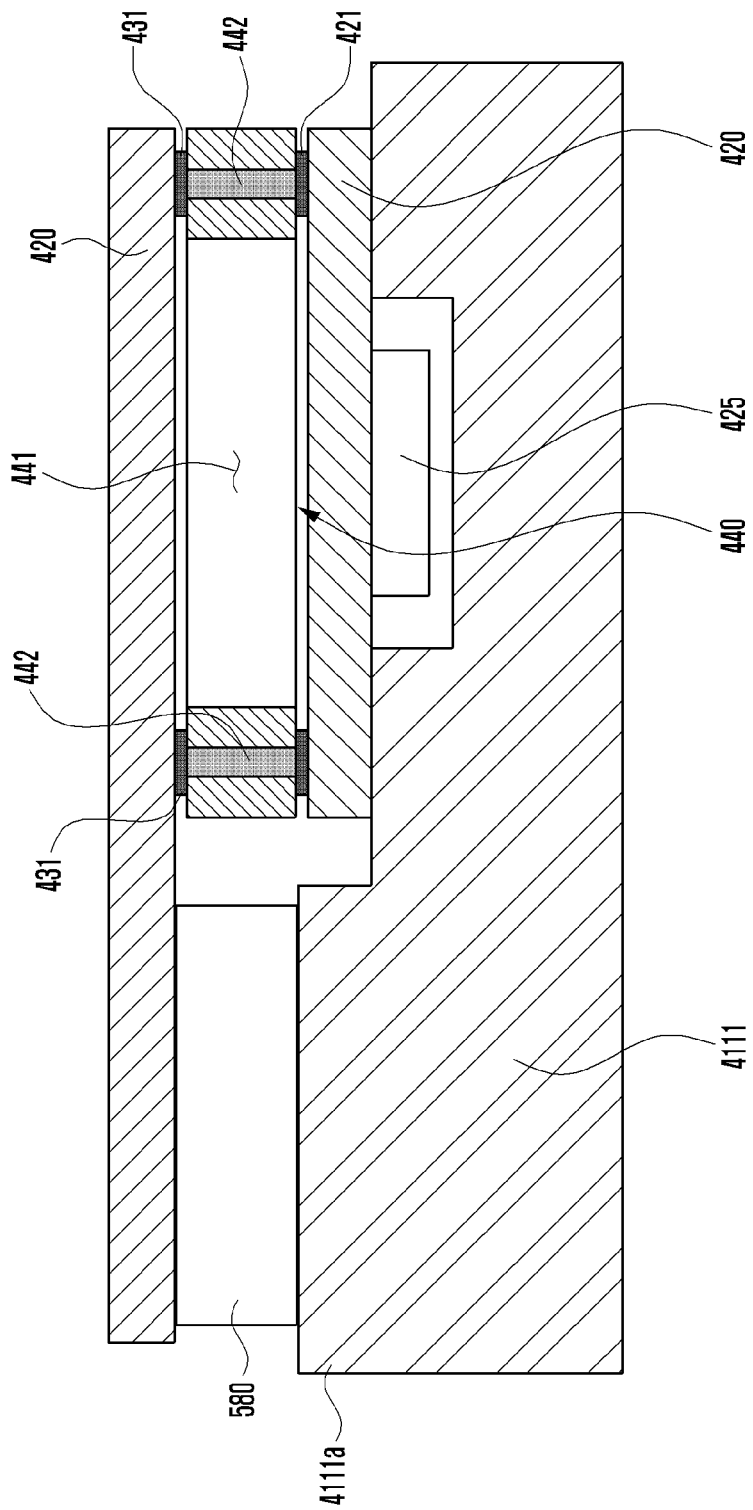
FIG. 16 is a cross-sectional view illustrating a state where an interposer is supported through an internal structure of an electronic device according to an embodiment of the disclosure.

FIG. 16 is a cross-sectional view illustrating a state where an interposer is supported through an internal structure of an electronic device according to an embodiment of the disclosure.

Referring to FIG. 16, an electronic device (e.g., electronic device 400 of FIG. 4) may include a first printed circuit board 420, a second printed circuit board 430 disposed to overlap the first printed circuit board 420 at least partly, a first interposer 440 disposed between the first printed circuit board 420 and the second printed circuit board 430, and a second interposer 580 disposed not to overlap the first printed circuit board 420 under the second printed circuit board 430. According to an embodiment, the first printed circuit board 420 may be formed with a smaller size than the size of the second printed circuit board 430. According to an embodiment, a part of the second printed circuit board 430, on which the second interposer 580 is disposed, may be supported through a support 4111a of the internal structure 4111 disposed in the inner space of the electronic device (e.g., electronic device 400 of FIG. 4). According to an embodiment, the internal structure 4111 may include the support 4111a deformed in a designated shape from the first support member (e.g., first support member 411 of FIG. 4) of the electronic device (e.g., electronic device 400 of FIG. 4). In a certain embodiment, the support 4111a may be separately disposed in the inner space of the electronic device (e.g., electronic device 400 of FIG. 4).

According to various embodiments, even if the second printed circuit board 430 is larger than the first printed circuit board 420, the second printed circuit board 430 is supported through the second interposer 580 that is supported by the internal structure 4111, and thus the second printed circuit board 430 can be prevented from being deformed to be bent or from being damaged by the external impact. According to an embodiment, the second interposer 580 may be replaced by at least one of the above-described interposers 450, 510, 520, 530, 540, 551, 552, 553, 561, 562, and 570.

Figure 17:
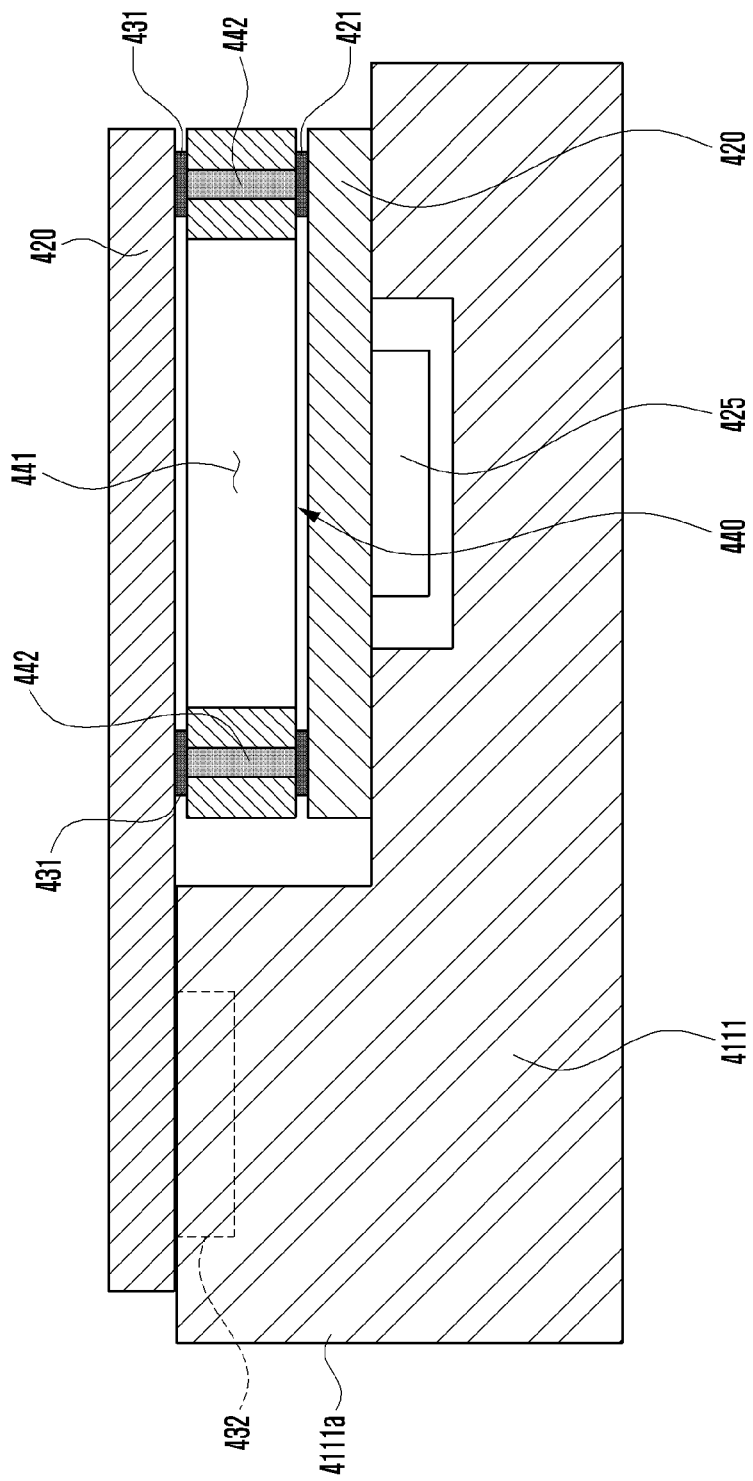
FIG. 17 is a cross-sectional view illustrating a state where a part of a second printed circuit board is supported through an internal structure of an electronic device according to an embodiment of the disclosure.

FIG. 17 is a cross-sectional view illustrating a state where a part of a second printed circuit board is supported through an internal structure of an electronic device according to an embodiment of the disclosure.

In explaining FIG. 17, the same reference numerals may be given to substantially the same constituent elements as those in FIG. 16, and the detailed explanation thereof may be omitted.

Referring to FIG. 17, a part of a second printed circuit board 430, which does not overlap a first printed circuit board 420 may be supported by a support 4111a formed through deformation of an internal structure 4111 of the electronic device (e.g., electronic device 400 of FIG. 4) or a separately added support. In this case, even if the second printed circuit board 430 is larger than the first printed circuit board 420, the second printed circuit board 430 is supported by the internal structure 4111, and thus the second printed circuit board 430 can be prevented from being deformed by being bent or from being damaged by an external impact. According to an embodiment, the support 4111a of the internal structure 4111 may be formed to support an electrical structure 432 (e.g., electrical connector, key button FPCB, shield can, or sound module enclosure) disposed on the second printed circuit board 430.

According to various embodiments, an electronic device (e.g., electronic device 400 of FIG. 4) may include: a housing (e.g., housing 110 of FIG. 1); a first printed circuit board (e.g., first printed circuit board 420 of FIG. 6) disposed in an inner space of the housing; a second printed circuit board (e.g., second printed circuit board 430 of FIG. 6) disposed to overlap at least a part of the first printed circuit board when the first printed circuit board is viewed from above; a first interposer (e.g., first interposer 440 of FIG. 6) disposed between the first printed circuit board and the second printed circuit board, and configured to electrically connect the first printed circuit board and the second printed circuit board to each other; and at least one second interposer (e.g., second interposer 450 of FIG. 6) disposed spaced apart from the first interposer between the first printed circuit board and the second printed circuit board when the first printed circuit board is viewed from above, and configured to electrically connect the first printed circuit board and the second printed circuit board to each other.

According to various embodiments, the second printed circuit board may include a protrusion part (e.g., protrusion part 4301 of FIG. 5) configured to protrude at least partly, and the at least one second interposer may be disposed in an area overlapping the protrusion part.

According to various embodiments, the electronic device may further include at least one electrical connection member (e.g., electrical connection member 460 of FIG. 8) disposed in the inner space, and at least a part of an area overlapping a protrusion part may be provided as a passage through which the electrical connection member passes.

According to various embodiments, the electronic device may include at least one opening formed to be connected to an inner space of the electronic device through the at least one second interposer, and may be configured not to overlap the second printed circuit board.

According to various embodiments, the at least one opening may include a first opening (e.g., first opening 520a of FIG. 8) into which the electrical connection member enters, and a second opening (e.g., second opening 520b of FIG. 8) which is disposed spaced apart from the first opening, and from which the electrical connection member is drawn out.

According to various embodiments, the electrical connection member may include at least one of a flexible printed circuit board (FPCB), a coaxial cable, or an FPCB type RF cable (FRC).

According to various embodiments, the first interposer may include a first loop-shaped opening (e.g., first opening 441 of FIG. 5).

According to various embodiments, the at least one second interposer may be disposed at a location not overlapping the first opening.

According to various embodiments, the at least one second interposer may be disposed in parallel to the first interposer, and may include a second loop-shaped opening (e.g., second opening 531 of FIG. 9 or second opening 541 of FIG. 10).

According to various embodiments, the at least one second interposer may be disposed at a location overlapping at least a part of the first opening.

According to various embodiments, the at least one second interposer may include a second loop-shaped opening.

According to various embodiments, the electronic device may include: a first electrical element (e.g., first electrical element 425 of FIG. 13B) disposed on the first printed circuit board, and a second electrical element (e.g., second electrical element 463 and 464 of FIG. 13B) disposed at a location overlapping the first opening on the second printed circuit board, wherein the second electrical element may be electrically connected to the first electrical element through the second interposer.

According to various embodiments, the first electrical element and the second electrical element may include at least one of a power management integrated circuit (PMIC), a radio frequency integrated circuit (RFIC), or a processor (e.g., an application processor (AP) and/or a communication processor (CP)).

According to various embodiments, the electronic device may include at least one support (e.g., support 465 of FIG. 14B) disposed to come in physical contact with the first printed circuit board and the second printed circuit board at a location overlapping the first opening between the first printed circuit board and the second printed circuit board when the first printed circuit board is viewed from above.

According to various embodiments, the at least one support may include a pan nut having a thickness to maintain a gap between the first printed circuit board and the second printed circuit board.

According to various embodiments, the at least one support may include a shield can for shielding a noise of an electrical element disposed on the first printed circuit board or the second printed circuit board.

According to various embodiments, the electronic device may include a display (e.g., display 101 of FIG. 1) disposed so as to be viewed from an outside through at least a part of the housing in the inner space.

According to various embodiments, the electronic device may include a first interposer (e.g., first interposer 440 of FIG. 6), and at least one second interposer (e.g., second interposer 450 of FIG. 6) disposed spaced apart from the first interposer between the first printed circuit board and the second printed circuit board when the first printed circuit board is viewed from above, and including a plurality of second conductive vias (e.g., plurality of second conductive vias 4511 of FIG. 6) configured to electrically connect the first printed circuit board and the second printed circuit board to each other.

According to various embodiments, an electronic device (e.g., electronic device 400 of FIG. 4) may include a housing (e.g., housing 110 of FIG. 1), a first printed circuit board (e.g., first printed circuit board 420 of FIG. 14B) disposed in an inner space of the housing, and including a plurality of first conductive terminals (e.g., the plurality of first conductive terminals 421 of FIG. 14B), a second printed circuit board (e.g., second printed circuit board 430 of FIG. 14B) disposed to overlap at least a part of the first printed circuit board when the first printed circuit board is viewed from above, and including a plurality of second conductive terminals (e.g., the plurality of second conductive terminals 431 of FIG. 14B), an interposer (e.g., first interposer 440 of FIG. 14B) including a plurality of conductive vias (e.g., a plurality of first conductive vias 442 of FIG. 14B) configured to electrically connect the first printed circuit board and the second printed circuit board to each other between the first printed circuit board and the second printed circuit board, and including a loop-shaped opening (e.g., first opening 441 of FIG. 14B), and at least one support (e.g., support 465 of FIG. 14B) disposed to come in physical contact with the first printed circuit board and the second printed circuit board at a location overlapping the opening between the first printed circuit board and the second printed circuit board when the first printed circuit board is viewed from above.

According to various embodiments, the at least one support may include a pan nut having a thickness to keep a gap between the first printed circuit board and the second printed circuit board.

According to various embodiments, the at least one support may include a shield can for shielding a noise of an electrical element disposed on the first printed circuit board or the second printed circuit board.

According to various embodiments, the at least one second interposer may be disposed between an area corresponding to the protrusion part of the second printed circuit board and the first printed circuit board.

According to various embodiments, in the area corresponding to the protrusion part of the second printed circuit board, the at least one second interposer forms a wall in a loop-shape via a first sub-board, a second sub-board, and a third sub-board, the wall in the loop-shape surrounding an opening.

According to various embodiments, wherein the first interposer may be disposed at a first edge of the second printed circuit board and the at least one second interposer is disposed at a second edge of the second printed circuit board opposite to the first edge.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a first printed circuit board disposed in an inner space of the housing;
a second printed circuit board overlapping at least a part of the first printed circuit board when the first printed circuit board is viewed from above;
a first interposer disposed between the first printed circuit board and the second printed circuit board, the first interposer electrically connecting the first printed circuit board to the second printed circuit board, the first interposer comprising a first loop-shaped opening; and
at least one second interposer spaced apart from the first interposer between the first printed circuit board and the second printed circuit board, the at least one second interposer electrically connecting the first printed circuit board to the second printed circuit board, the at least one second interposer comprising a second loop-shaped opening,
wherein the second loop-shaped opening does not overlap the first loop-shaped opening when the first printed circuit board is viewed from above.

2. The electronic device of claim 1,
wherein the second printed circuit board comprises a protrusion part configured to protrude at least partly, and
wherein the at least one second interposer is disposed in an area overlapping the protrusion part.

3. The electronic device of claim 2, further comprising:
at least one electrical connection member disposed in the inner space,
wherein at least a part of an area overlapping the protrusion part is provided as a passage through which the at least one electrical connection member passes.

4. The electronic device of claim 3, further comprising:
at least one opening part connected to the inner space of the housing through the at least one second interposer.

5. The electronic device of claim 4, wherein the at least one opening part comprises:
a first opening part into which the at least one electrical connection member enters; and
a second opening part which is disposed spaced apart from the first opening part, and from which the at least one electrical connection member is drawn out.

6. The electronic device of claim 3, wherein the at least one electrical connection member comprises at least one of a flexible printed circuit board (FPCB), a coaxial cable, or an FPCB type radio frequency (RF) cable (FRC).

7. The electronic device of claim 1, wherein the at least one second interposer is disposed at a location not overlapping the first loop-shaped opening.

8. The electronic device of claim 1,
wherein the at least one second interposer is disposed parallel to the first interposer.

9. The electronic device of claim 1, further comprising:
at least one support physical contacting the first printed circuit board and the second printed circuit board at a location overlapping the first loop-shaped opening between the first printed circuit board and the second printed circuit board when the first printed circuit board is viewed from above.

10. The electronic device of claim 9, wherein the at least one support comprises a pan nut or a shield can having a thickness to maintain a gap between the first printed circuit board and the second printed circuit board.

11. The electronic device of claim 10, wherein the shield can of the at least one support is configured to shield noise of an electrical element disposed on the first printed circuit board or the second printed circuit board.

12. The electronic device of claim 1, further comprising:
a display disposed so as to be viewed from an outside of the electronic device through at least a part of the housing in the inner space.

13. An electronic device comprising:
a housing;
a first printed circuit board disposed in an inner space of the housing;
a second printed circuit board overlapping at least a part of the first printed circuit board when the first printed circuit board is viewed from above;
a first interposer disposed between the first printed circuit board and the second printed circuit board, the first interposer electrically connecting the first printed circuit board to the second printed circuit board, the first interposer comprising a first loop-shaped opening: and
at least one second interposer spaced apart from the first interposer between the first printed circuit board and the second printed circuit board, the at least one second interposer electrically connecting the first printed circuit board to the second printed circuit board, the at least one second interposer comprising a second loop-shaped opening,
wherein the at least one second interposer is disposed at a location overlapping at least a part of the first loop-shaped opening when the first printed circuit board is view from above.

14. The electronic device of claim 13, further comprising:
a first electrical element disposed on the first printed circuit board; and
a second electrical element disposed at a location overlapping the first loop-shaped opening on the second printed circuit board, wherein the second electrical element is electrically connected to the first electrical element through the at least one second interposer.

15. The electronic device of claim 14, wherein the first electrical element and the second electrical element comprise at least one of a power management integrated circuit (PMIC), a radio frequency integrated circuit (RFIC), an application processor (AP), or a communication processor (CP).

16. An electronic device comprising:
   a housing;
   a first printed circuit board disposed in an inner space of the housing, and including a plurality of first conductive terminals;
   a second printed circuit board disposed to overlap at least a part of the first printed circuit board when the first printed circuit board is viewed from above, and including a plurality of second conductive terminals;
   an interposer including a plurality of conductive vias configured to electrically connect the first printed circuit board to the second printed circuit board between the first printed circuit board and the second printed circuit board, and including a loop-shaped opening; and
   at least one support disposed to come in physical contact with the first printed circuit board and the second printed circuit board at a location overlapping the loop-shaped opening between the first printed circuit board and the second printed circuit board when the first printed circuit board is viewed from above,
   wherein the at least one support includes a pan nut having a thickness to keep a gap between the first printed circuit board and the second printed circuit board or a shield can for shielding a noise of an electrical element disposed on the first printed circuit board or the second printed circuit board.

* * * * *